United States Patent [19]
Bowers

[11] Patent Number: 5,721,512
[45] Date of Patent: Feb. 24, 1998

[54] CURRENT MIRROR WITH INPUT VOLTAGE SET BY SATURATED COLLECTOR-EMITTER VOLTAGE

[75] Inventor: Derek F. Bowers, Sunnyvale, Calif.

[73] Assignee: Analog Devices, Inc., Norwood, Mass.

[21] Appl. No.: 636,315

[22] Filed: Apr. 23, 1996

[51] Int. Cl.$^6$ ....................................................... H03F 3/04
[52] U.S. Cl. ........................... 330/288; 323/315; 330/307
[58] Field of Search .................................. 330/288, 307; 323/315, 316

[56] References Cited

U.S. PATENT DOCUMENTS

| | | | |
|---|---|---|---|
| 4,051,391 | 9/1977 | Ahmed | 323/315 X |
| 4,870,533 | 9/1989 | Bahlmann | 323/316 X |
| 4,937,515 | 6/1990 | Yoshino | 330/288 X |

FOREIGN PATENT DOCUMENTS

| | | | |
|---|---|---|---|
| 0033717 | 2/1985 | Japan | 330/288 |

OTHER PUBLICATIONS

*The Circuits and Filters Handbook*, ed. Wai-Kai Chen, CRC Press, 1995, pp. 1619–1624.

*Electronics Engineers' Handbook*, ed. by Fink and Christiansen, McGraw Hill Book Company, 1989, pp. 8–11 through 8–12.

Primary Examiner—James B. Mullins
Attorney, Agent, or Firm—Koppel & Jacobs

[57] ABSTRACT

A bipolar transistor current mirror circuit has the bases of its input and output transistors connected together, but decouples the input transistor's collector from its base so that the mirror input voltage is no longer tied to the input transistor's base-emitter voltage. Instead, a separate base current source supplies sufficient base current to the mirror's input transistor to keep it in saturation, while a parasitic transistor that results from a junction isolated fabrication process drains off excess current from the base current source to keep it in balance with the mirror transistor base currents. The resulting input voltage is a function of the input transistor's saturated collector-emitter voltage, which is substantially lower than the base-emitter voltage and provides more voltage head room.

13 Claims, 2 Drawing Sheets

5,721,512

CURRENT MIRROR WITH INPUT VOLTAGE SET BY SATURATED COLLECTOR-EMITTER VOLTAGE

BACKGROUND OF THE INVENTION

1. Field of the Invention

This invention relates to current mirror circuits and operating methods, and particularly to current mirrors that employ junction is related bipolar transistors.

2. Description of the Related Art

A current mirror is a circuit that reproduces a reference or input current at one or more locations in an overall circuit. Various well known types of current mirrors are described, for example, in *The Circuits and Filters Handbook*, ed. Wai-Kai Chen, CRC Press, 1995, pages 1619–1624. Current mirrors are commonly used as loads for amplifier stages and as important building blocks in modern current-mode analog integrated circuits.

A simple conventional current mirror is illustrated in FIG. 1. It consists of a pair of bipolar transistors Q1 and Q2 of the same conductivity and with their bases connected together; in this illustration the transistors are npn, but pnp transistors can also be used with an appropriate modification of the circuit connections. The mirror is shown as part of an overall circuit that is connected between high and low voltage supply lines Vcc and Vee; Vee is generally at ground potential, but does not have to be in all cases. The remainder of the overall circuit external to the mirror is identified by reference number 2.

The circuit 2 supplies an input current Iin towards the collector of Q1, which functions as an input transistor for the mirror. The collector of Q1 is connected to the bases of Q1 and Q2. The emitters of Q1 and Q2 are tied together to Vee, either directly as shown or through intermediate circuitry. The collector current of Q2, designated Iout, mirrors the input current to Q1 and provides a mirror output current to the remaining circuitry 2. The ratio of Iout/Iin is determined by the relative transistor scalings. If the emitter of Q2 is equal in size to the emitter of Q1, Iout will (approximately) equal Iin; if the emitter of Q2 is scaled twice as large as the Q1 emitter, Iout will be (approximately) twice Iin, and so forth. The term "mirror" as used herein thus includes both equal input and output currents, and output currents that are proportional to the input current in accordance with transistor scalings. Multiple output transistors can be provided if desired, each with its own scaling relative to Q1.

Each transistor absorbs a base current equal to its collector current divided by the transistor current gain $\beta$. For the single output transistor mirror of FIG. 1, with both transistors scaled equally, the transfer function is:

$$Iout/Iin=1/(1+2/\beta)$$

The term $2/\beta$ reflects the fact that Iin must supply current to the bases of both Q1 and Q2.

The mirror's input voltage Vin is the voltage at the collector of Q1. Since the collector and base of Q1 are tied together, Vin will exceed the Q1 emitter voltage by the transistor's base-emitter voltage Vbe, which is generally about 0.6 volts at 25° C. Thus, assuming that the Q1 emitter is tied to ground, Vin will be about 0.6 volts. For modern low voltage circuits, such as battery driven circuits in which Vcc can be less than one volt, a Vin of 0.6 volts may not leave enough voltage "head room" for the remainder of the circuit. It would therefore be highly desirable to significantly reduce Vin, but without impairing the operation of the current mirror.

SUMMARY OF THE INVENTION

This invention seeks to provide a new current mirror circuit and associated operating method which produces a substantially lower value of Vin, does not significantly add to the cost or complexity of the circuit, and preserves a desired current mirroring effect.

These goals are realized by eliminating the short circuit between the collector and base of the input transistor, thereby freeing Vin from the input transistor's Vbe, and substituting a separate current source that provides sufficient base current to keep the input transistor in saturation. A parasitic transistor that is inherent in a junction isolated circuit structure drains off excess current from the base current source to keep it in balance with the actual transistor base currents. The parasitic transistor is held on when the mirror's input transistor is saturated, which is the normal operating condition. Vin is thus a function of the input transistor's saturated collector-emitter voltage, which is typically in the range of about 50–150 millivolts, substantially lower than the prior Vin of about 0.6 volts.

These and other features and advantages of the invention will be apparent to those skilled in the art from the following detailed description, taken together with the accompanying drawings, in which:

DETAILED DESCRIPTION OF THE INVENTION

Figure 2:
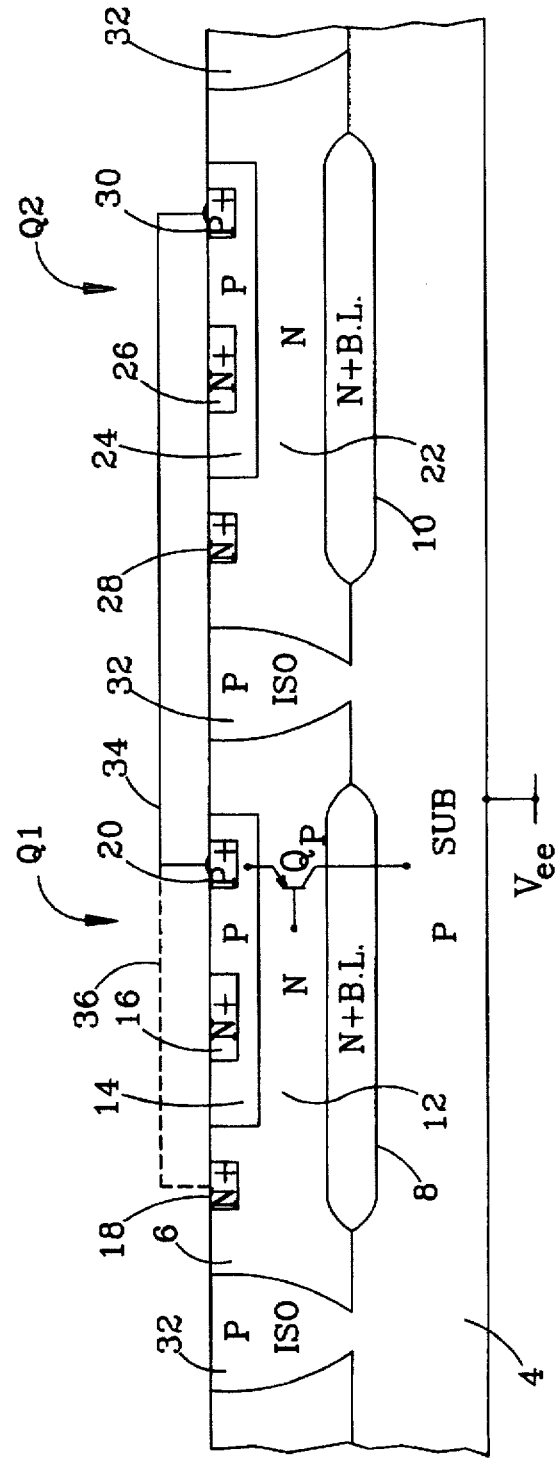
FIG. 2 is a sectional view of an integrated circuit structure with the current mirror transistors of the present invention.

FIG. 2 shows the internal structure of an integrated circuit chip in which input and output current mirror transistors Q1 and Q2 have been formed by a junction isolation process. The transistors are illustrated as being npn; a circuit with pnp transistors can also be implemented by reversing doping polarities.

The transistors Q1 and Q2 are formed on a p-type semiconductor substrate 4 upon which an n-type semiconductor epitaxial layer 6 has been grown. N+ buried layers 8 and 10 at the junctions between the substrate and the epitaxial layer for Q1 and Q2, respectively, lower the transistor collector resistances. Q1 has its collector 12 formed from the portion of the n-type epitaxial layer immediately above the substrate and buried layer 8, its base from a p-type layer 14 implanted into the epitaxial layer above the collector region 12, and its emitter from an n+ region 16 implanted into the base region. N+ and p+ implanted regions 18 and 20 provide contacts to the collector and base regions, respectively. Output transistor Q2 has a similar structure, with an n-type collector layer 22 over the substrate and buried layer 10, a p-type base well 24 set in the collector layer, an n+ emitter 26 in the base well, and collector and base contact implants 28 and 30. P-type isolation barriers 32 isolate the transistor structures from each other and from other devices on the chip.

The circuit structure as described thus far is conventional. With the junction isolation process a parasitic pnp transistor is established with the p-type base region 4 of Q1 as its emitter, the n-type Q1 collector region 12 as its base, and the p-type substrate 4 as it collector; this parasitic transistor is shown schematically in FIG. 2 and identified as Qp. The junction isolation process is described in general and contrasted with the dielectric isolation process, which does not produce a comparable parasitic transistor, in *Electronics Engineers' Handbook*, ed. by Fink and Christiansen, McGraw Hill Book Company, 1989, pages 8–11 through 8–12.

Qp is turned on, or conductive, when Q1 is operating in saturation. Instead of being merely an undesirable by-product of the transistor fabrication process as is the case with most parasitics, Qp is used in a positive fashion by the invention to implement a current mirror circuit that decouples the input transistor's collector from its base, thereby freeing Vin from the base-emitter voltage of Q1.

The normal short circuit between the bases of Q1 and Q2 is indicated by connector line 34. However, the normal short circuit between the base and collector of Q1 is shown by a dashed line 36, indicating that this connector is not present in the invention. Rather, sufficient base current is supplied to the bases of Q1 and Q2 from a separate current source to keep the input transistor Q1 in saturation, while Q2 operates in its normal unsaturated forward active region. The parasitic transistor Qp drains off any surplus current to the substrate, keeping the base current source in balance with the Q1 and Q2 base currents. Since the base current source must supply sufficient current to keep Q1 saturated under all expected operating conditions, such as temperatures at the upper end of its operating range, during most operating conditions the current source will supply a surplus of current beyond that necessary to keep Q1 saturated. Without the current drain provided by Qp, this surplus current could force the base voltages of Q1 and Q2 to undesirably high levels.

Figure 3:
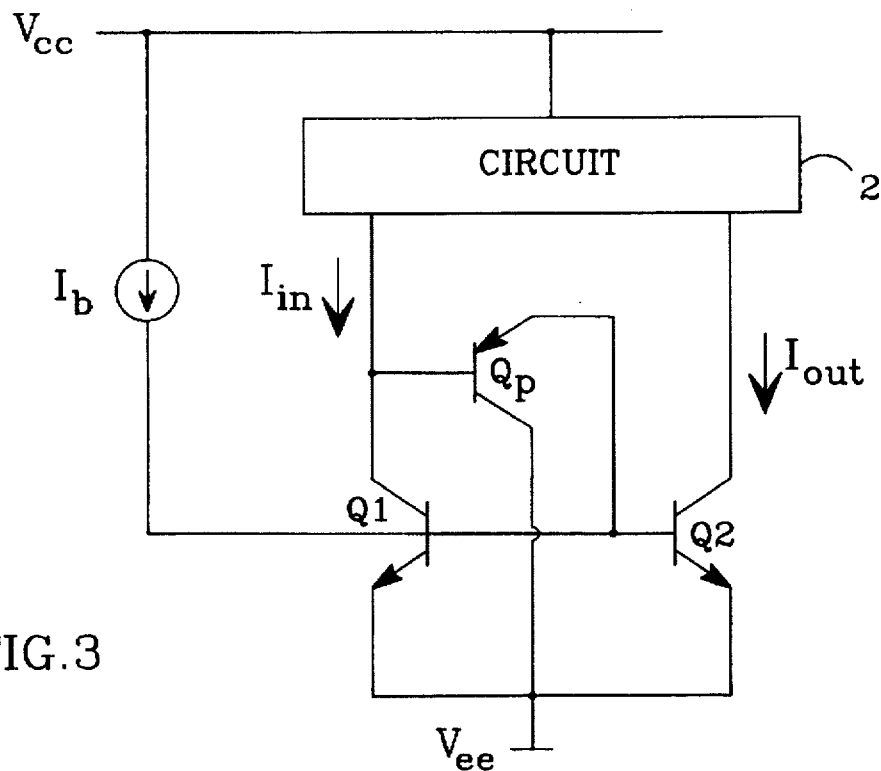
FIG. 3 is a schematic diagram of a preferred implementation of the invention using npn mirror transistors.

A schematic diagram is given in FIG. 3 for a new current mirror circuit based upon the integrated circuit structure shown in FIG. 2. It is similar to the conventional circuit of FIG. 1, but the short circuit between the collector and base of Q1 has been eliminated and in its place a base current source Ib supplies current from Vcc to the bases of Q1 and Q2. Base current source Ib is preferably implemented in a conventional manner as a transistor with a constant bias; it can be connected to Vcc either directly as shown or through intermediate circuitry. The parasitic transistor Qp is also shown in FIG. 3, with its base connected to the collector of Q1 and its collector-emitter circuit connected to conduct current from the bases of Q1 and Q2 to the substrate, which is illustrated as being held at Vee.

Figure 1:
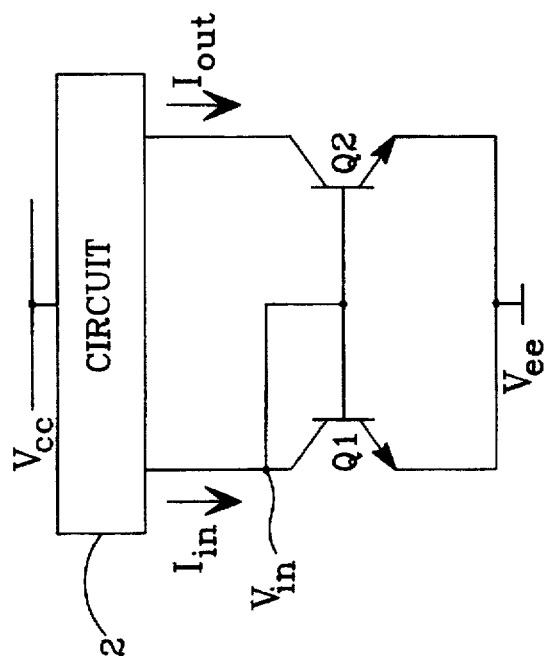
FIG. 1 is a schematic diagram, discussed above, of a conventional current mirror circuit.

It can be seen from FIG. 3 that Vin at the collector of Q1 will track the Q1 emitter voltage by the saturated collector-emitter voltage (Vce) for Q1, rather than Vbe as in the prior mirror circuit of FIG. 1. Since the saturated Vce will generally be in the range of about 50–150 millivolts, decoupling Q1's collector from its base and substituting Ib and Qp produces a considerable improvement over the prior input differential of about 0.6 volts between the collector and emitter of Q1.

The base current of Qp will add to Iin in establishing the Q1 collector current. Therefore, the collector current of Q1 will not be exactly equal to Iin, and Iout will accordingly also not exactly equal Iin. However, this inaccuracy is not excessive for many applications. In the FIG. 1 circuit the current drawn away from Iin to supply the base currents of Q1 and Q2 will be equal to 2Iin/$\beta$, or about 0.04Iin if $\beta$ for Q1 and Q2 is assumed to be 50. With the new FIG. 3 circuit, by contrast, the descrepancy between Iin and the Q1 collector current is reduced by a further factor on the order of the Qp current gain $\beta$p.

The current supplied by Ib must be sufficient to keep Q1 saturated, and is preferably at least equal to about 2Iin/$\beta$p. Assuming that Ib supplies a current that is actually twice the sum of the Q1 and Q2 base currents at a particular operating temperature, half of Ib will flow into the bases of Q1 and Q2 and the other half will flow through the collector-emitter circuit of Qp. Thus, the base current for Qp will be equal to the collector-emitter current of Qp divided by $\beta$p, which is typically on the order of 70. As a result, the amount of Qp base current which adds to Iin to form the Q1 collector current will only be about 0.0006Iin (2Iin/$\beta_{Q1}$/$\beta$p). This is a considerably higher accuracy than with the prior circuit.

Figure 4:
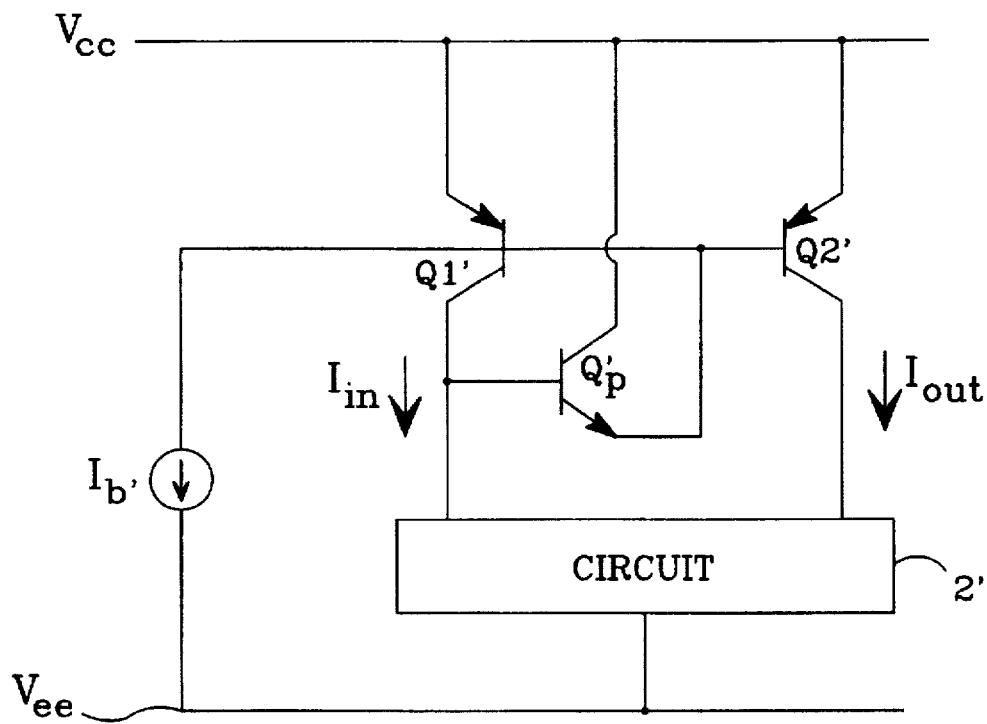
FIG. 4 is a schematic diagram of a preferred implementation of the invention using pnp mirror transistors.

The invention has been described thus far with npn transistors for Q1 and Q2. It is also applicable to pnp current mirrors, in which case the conductivity of the parasitic transistor formed with the junction isolation process is also reversed. With pnp mirror transistors the orientation of the base current source also needs to be reversed so that it draws current out of the mirror transistor bases to keep them saturated. This type of circuit is shown in FIG. 4, with the various elements that correspond to the elements of FIG. 3 but with reverse conductivities indicated by the same reference numbers primed.

While particular embodiments of the invention have been shown and described, numerous variations and alternate embodiments will occur to those skilled in the art. For example, the principles of the invention can be applied to more advanced current mirror circuits, such as Wilson and Widlar mirrors, and also to mirrors with multiple outputs. Accordingly, it is intended that the invention be limited only in the term of the appended claims.

I claim:

1. A saturating current mirror circuit, comprising:
  input and output bipolar transistors of the same conductivity having respective bases, collectors and emitters, with the bases of said transistors connected together and the collector of said output transistor providing an output current which approximately mirrors the input transistor's collector current,
  a base current source which provides base current to said transistors to keep the input transistor in saturation with the input transistor's collector-emitter voltage less than its base-emitter voltage, and
  a parasitic transistor that is on when the input transistor is saturated and, together with the base currents of said input and output transistors, balances said base current source.

2. The current mirror circuit of claim 1, wherein said parasitic transistor has a conductivity opposite to said input and output transistors.

3. The current mirror circuit of claim 2, wherein said input and output transistors are in respective junction isolated pockets.

4. The current mirror circuit of claim 2, further comprising a substrate for said input and output transistors of opposite conductivity of their emitters and collectors, wherein the parasitic transistor's base, emitter and collector are connected respectively to the input transistor's collector, to the bases of the input and output transistors and to said substrate.

5. A saturating current mirror structure, comprising:
  a semiconductor substrate doped to one conductivity, a pair of mutually isolated transistors on said substrate, each of said transistors including a semiconductor collector layer over said substrate doped to a conductivity opposite to the substrate, a semiconductor base layer in said collector layer doped to said one conductivity and forming a base/collector junction with said collector layer, and a semiconductor emitter layer in said base layer doped to said opposite conductivity, an electrical connection between the base layers of said transistors, and a current source connected to provide saturating base current to the base layers of said transistors to keep the transistors' collector-emitter voltages less than their base-emitter voltages, said base layers having no direct connections to their respective collector layers except through their respective base/collector junctions.

6. The current mirror structure of claim 5, one of said transistors comprising an input transistor, the input transistor base and collector layers and said substrate respectively forming the emitter, base and collector of a parasitic transistor that is on when said input transistor is saturated and that drains excess base current from said transistor.

7. The saturating current mirror structure of claim 6, wherein said mutually isolated transistors are formed in respective junction isolated transistor pockets on said substrate.

8. A method of operating a current mirror circuit that includes input and output bipolar transistors whose bases are connected together, comprising:

providing an input current to the collector of said input transistor, providing a base current to the base of said input transistor sufficient to hold it in saturation with its collector-emitter voltage less than its base-emitter voltage, draining excess base current from said input transistor when it is saturated by holding on a parasitic transistor which conducts current away from the input and output transistor bases in response to the input transistor saturating, but is inactive in the absence of input current to the input transistor, and taking an output current which mirrors said input current from the collector of said output transistor.

9. An electrical circuit employing a saturating current mirror, comprising:

a voltage supply bus, a functional circuit supplied by said voltage supply bus, and a saturating current mirror circuit, comprising:

input and output bipolar transistors of the same conductivity having respective bases, collectors and emitters, with the bases of said transistors connected together, said functional circuit providing an input current for the collector of said input transistor, and the collector of said output transistor providing an output current for said functional circuit which approximately mirrors said input current, a base current source which provides base current to said input transistor to keep it in saturation with the input transistor's collector-emitter voltage less than its base-emitter voltage, and a current balancing parasitic bipolar transistor which is held on in response to the input transistor saturating, is inactive in the absence of input current to the input transistor, has a base connected to the collector of said input transistor, and a collector-emitter circuit connected to the bases of said input and output transistors to balance said input current with the input and output transistor base currents.

10. The electrical circuit of claim 9, implemented on a doped semiconductor substrate, said current balancing parasitic bipolar transistor formed by said substrate and the collector and base of said input transistor.

11. The electrical circuit of claim 10, wherein said input and output transistors are in respective junction isolated pockets.

12. The electrical circuit of claim 9, wherein said functional circuit provides an input current that does not exceed a maximum expected value, said current balancing transistor has a predetermined current gain $\beta$, and the base current provided by said base current source to said input transistor is sufficient to maintain said input transistor in saturation.

13. The electrical circuit of claim 9, wherein the input voltage of said current mirror circuit at the collector of said input transistor is a function of the collector-emitter saturation voltage of said input transistor independent of its base-emitter voltage.

* * * * *